United States Patent
Smith

(10) Patent No.: US 9,116,180 B2
(45) Date of Patent: Aug. 25, 2015

(54) CURRENT SENSING SYSTEM AND METHOD

(71) Applicant: Harold Arthur Smith, Tyrone, GA (US)

(72) Inventor: Harold Arthur Smith, Tyrone, GA (US)

(73) Assignee: Panasonic Automotive Systems Company of America, Division of Panasonic Corporation of North America, Peachtree City, GA (US)

( * ) Notice: Subject to any disclaimer, the term of this patent is extended or adjusted under 35 U.S.C. 154(b) by 461 days.

(21) Appl. No.: 13/676,342

(22) Filed: Nov. 14, 2012

(65) Prior Publication Data

US 2013/0069631 A1    Mar. 21, 2013
US 2013/0278242 A9    Oct. 24, 2013

Related U.S. Application Data

(63) Continuation of application No. 11/818,489, filed on Jun. 14, 2007, now Pat. No. 8,339,202.

(51) Int. Cl.
*H04B 1/00* (2006.01)
*G01R 19/25* (2006.01)
*B60L 11/18* (2006.01)
*G01R 19/00* (2006.01)

(52) U.S. Cl.
CPC ............. *G01R 19/25* (2013.01); *B60L 11/1861* (2013.01); *G01R 19/0092* (2013.01); *Y02T 10/7005* (2013.01); *Y02T 10/705* (2013.01); *Y02T 10/7044* (2013.01)

(58) Field of Classification Search
CPC .. G01R 19/0092; G01R 19/25; G01R 19/165; H03M 1/00; H03M 2201/01; H03M 2201/198; H03M 2201/30
USPC ................. 381/86, 77, 389, 302, 55, 56, 365; 330/298, 265, 202, 253; 323/311, 282, 323/312; 324/120, 426
See application file for complete search history.

(56) References Cited

U.S. PATENT DOCUMENTS

| | | | | |
|---|---|---|---|---|
| 4,637,049 | A | * | 1/1987 | Kunugi ............................ 381/86 |
| 5,815,012 | A | * | 9/1998 | Rivoir et al. ................... 327/103 |
| 6,114,774 | A | * | 9/2000 | Fiegura ........................... 307/9.1 |
| 6,559,720 | B1 | * | 5/2003 | Huijsing et al. ............... 330/253 |
| 7,268,714 | B2 | * | 9/2007 | Sherry ............................ 341/139 |
| 8,339,202 | B2 | * | 12/2012 | Smith ............................ 330/298 |

* cited by examiner

*Primary Examiner* — Lun-See Lao
(74) *Attorney, Agent, or Firm* — Laurence S. Roach, Esq.

(57) ABSTRACT

There is provided a current sense circuit (134). An exemplary current sense circuit (134) comprises a voltage-to-current converter circuit (218) that is adapted to receive a voltage that is proportional to a load current drawn from a battery (110) by a load (202) and to produce a current proportional to the load current, and a current-to-voltage converter circuit (228) that is adapted to receive the current proportional to the load current and to produce a voltage proportional to the load current based on a regulated voltage source (230).

20 Claims, 4 Drawing Sheets

CURRENT SENSING SYSTEM AND METHOD

CROSS-REFERENCE TO RELATED APPLICATION

This application is a continuation of U.S. patent application Ser. No. 11/818,489, filed on Jun. 14, 2007 which is currently under allowance, the disclosure of which are hereby incorporated by reference in their entirety for all purposes.

FIELD OF THE INVENTION

The present invention generally relates to automotive audio systems. In particular, the present invention relates to a current sensing circuit having a wide common mode voltage tolerance, measurement device protection and current limiting.

BACKGROUND OF THE INVENTION

In many electronic systems, it is desirable to be able to measure the current drawn by one or more components or subsystems. Current drawn is related to the overall energy consumption of the system. If the current drawn by all devices of interest is accurately sensed, an accurate computation of energy being consumed by the system may be performed. If current measurements are not accurate, the accuracy of the overall energy calculation is reduced. Most motorized vehicles (for example, cars, buses and the like) include electronic systems that are subject to adverse conditions that may impact the accuracy of current measurements because of the location of the electronic systems in or on the vehicle. A significant factor that may affect current measurement accuracy is that automotive batteries are typically subject to wide swings in output voltage. Battery voltage swings result from many factors, including loading and state of battery charge. Another factor that is likely to affect measurement accuracy is a wide variation in temperature at the location where current is being measured. For example, an automotive engine compartment is subject to wide temperature variation depending on such factors as operating conditions and seasonal temperature change.

In addition, it may be desirable to provide short circuit protection for a load while the current flow to the load is measured. Another complicating factor is the desire to obtain an accurate current measurement in a manner that utilizes as little battery voltage as possible. In systems in which it is desirable to provide a digital value corresponding current drawn by a load, still another factor complicating current measurement is the desirability of protecting an analog-to-digital converter adapted to produce the digital value from being damaged by an over-voltage condition. For these reasons, it is a challenging problem to obtain accurate current draw measurements for devices and electronic systems that are powered by a battery in a motor vehicle.

SUMMARY OF THE INVENTION

There is provided a current sense circuit. An exemplary current sense circuit comprises a voltage-to-current converter circuit that is adapted to receive a voltage that is proportional to a load current drawn from a battery by a load and to produce a current proportional to the load current, and a current-to-voltage converter circuit that is adapted to receive the current proportional to the load current and to produce a voltage proportional to the load current based on a regulated voltage source.

BRIEF DESCRIPTION OF THE DRAWINGS

The above-mentioned and other features and advantages of the present invention, and the manner of attaining them, will become apparent and be better understood by reference to the following description of one embodiment of the invention in conjunction with the accompanying drawings, wherein.

Corresponding reference characters indicate corresponding parts throughout the several views. The exemplifications set out herein illustrate a preferred embodiment of the invention, in one form, and such exemplifications are not to be construed as limiting in any manner the scope of the invention.

DETAILED DESCRIPTION OF THE PREFERRED EMBODIMENTS

This section is intended to introduce the reader to various aspects of art which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Figure 1:
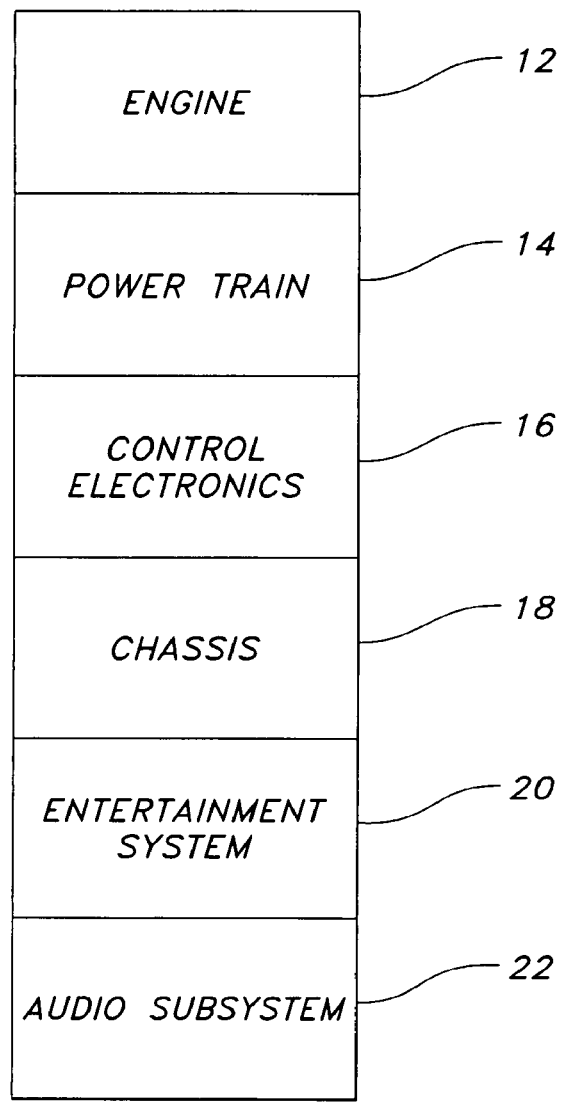
FIG. 1 is a block diagram of a motorized vehicle in accordance with an exemplary embodiment of the present invention.

FIG. 1 is a block diagram of a motorized vehicle in accordance with an exemplary embodiment of the present invention. The motorized vehicle is generally represented by the reference number 10. The exemplary motorized vehicle 10 comprises an engine 12, a power train 14, a plurality of electronic control systems 16 that may be adapted to control a number of vehicle systems (for example, the engine, the power train, a heating ventilation air conditioning (HVAC) system, to name a few examples), and a chassis 18. The chassis 18 is adapted to support the engine 12, which is adapted to drive the power train 14. Also included in the exemplary motorized vehicle 10 is an entertainment system, which may provide audio/visual entertainment, computer networking capability or the like to occupants of the motorized vehicle 10. The entertainment system 20 comprises an audio subsystem 22, the operation of which is explained in greater detail below.

Figure 2:
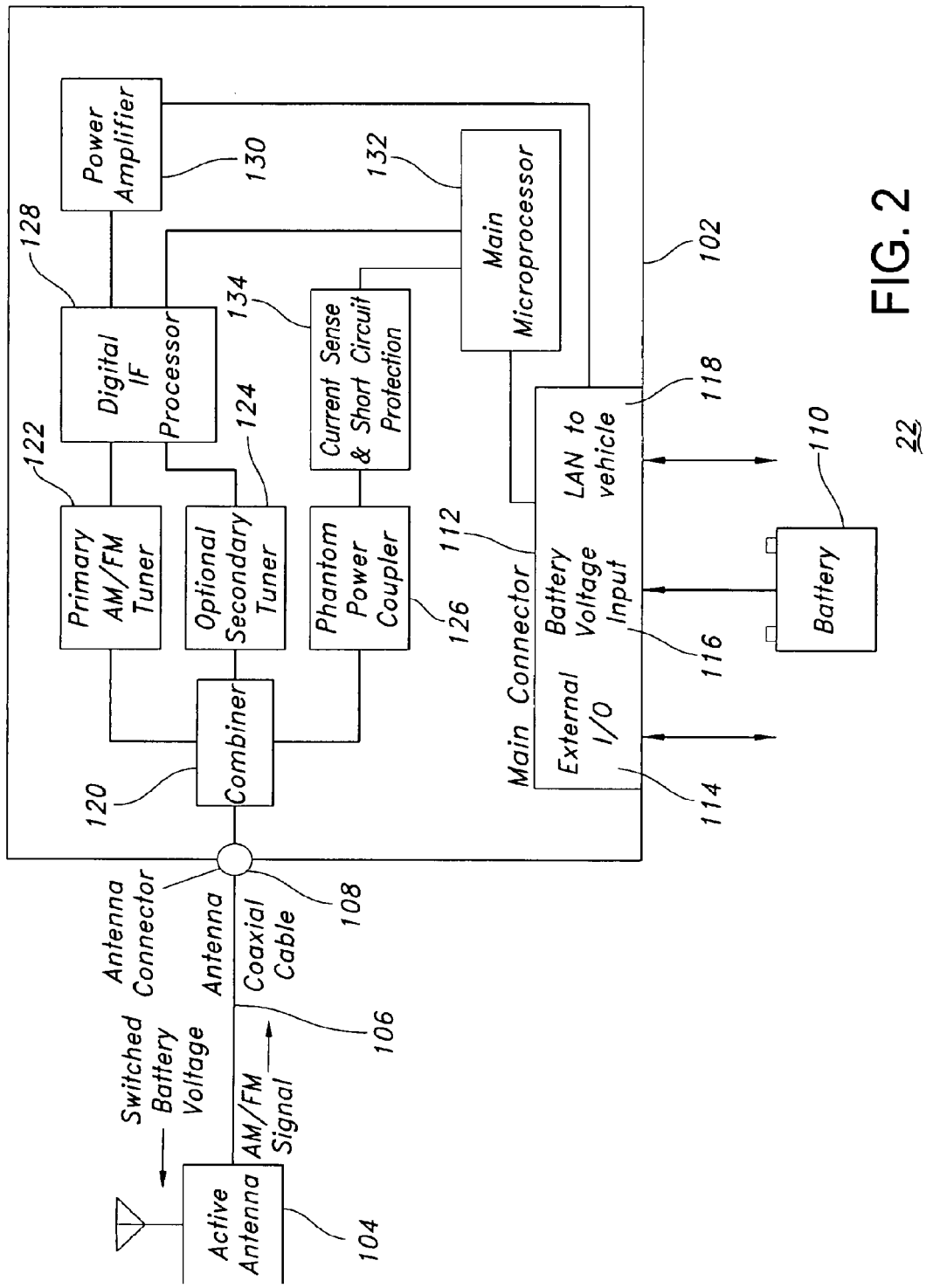
FIG. 2 is a block diagram of an audio subsystem of the vehicle shown in FIG. 1 in accordance with an exemplary embodiment of the present invention.

FIG. 2 is a block diagram of the audio subsystem 22 of the vehicle 10 shown in FIG. 1 in accordance with an exemplary embodiment of the present invention. The audio subsystem 22 comprises an audio processing module 102. An active antenna 104 is adapted to receive a broadcast signal such as an AM/FM radio signal. Those of ordinary skill in the art will appreciate that the active antenna 104 may be adapted to receive other types of signals, such as satellite radio signals or the like. The broadcast signal received by the active antenna 104 is delivered via a coaxial cable 106 to the audio processing module 102 via an antenna connector 108. As set forth below in greater detail, it may be desirable to measure a current flow being drawn by the active antenna 104.

A battery 110, such as a typical automotive battery, is adapted to deliver voltage to a main connector 112 of the audio processing module 102. Specifically, the battery is adapted to deliver an input voltage to a battery voltage input 116 of the main connector 112. The main connector 112 may include inputs and/or outputs for additional signals. For example, the main connector 112 may include an external I/O signal 114 and/or a network communications signal such as a LAN signal 118.

The broadcast signal received by the active antenna 104 is delivered to a combiner 120. The combiner 120 provides the signal to a primary AM/FM tuner 122, an optional secondary tuner 124 and a phantom power coupler 126. The phantom power coupler 126 is adapted to couple DC voltage from the battery 110 onto the coaxial cable 106 feeding the active antenna 104, without compromising reception of radio signals on the coaxial cable 106. Outputs from the primary AM/FM tuner 122 and the optional secondary tuner 124 are delivered to a digital IF processor 128 for processing. The digital IF processor 128 is powered by a power amplifier 130, which receives power from battery voltage input 116 of the main connector 112.

A main microprocessor 132 is adapted to control the overall operation of the audio processing module 102. The battery voltage input 116 provides power to the main microprocessor 132. The digital IF processor 128 delivers demodulated audio to the power amplifier 130, which delivers amplified audio to the main connector 112. Those of ordinary skill in the art will appreciate that control and status signals are exchanged between the digital IF processor 128 and the main microprocessor 132. Moreover, the main microprocessor 132 does not directly receive audio signals from the digital IF processor 128, but instead receives information in response to queries. That information may include information about the audio signals being processed. The amplified audio signal from the power amplifier 130 is used to provide an audio program for occupants of the vehicle 10 (FIG. 1). As explained in detail below, the main microprocessor 132 is adapted to measure the current drawn by the active antenna 104 using a current sense and short circuit protection circuit 134.

Figure 3:
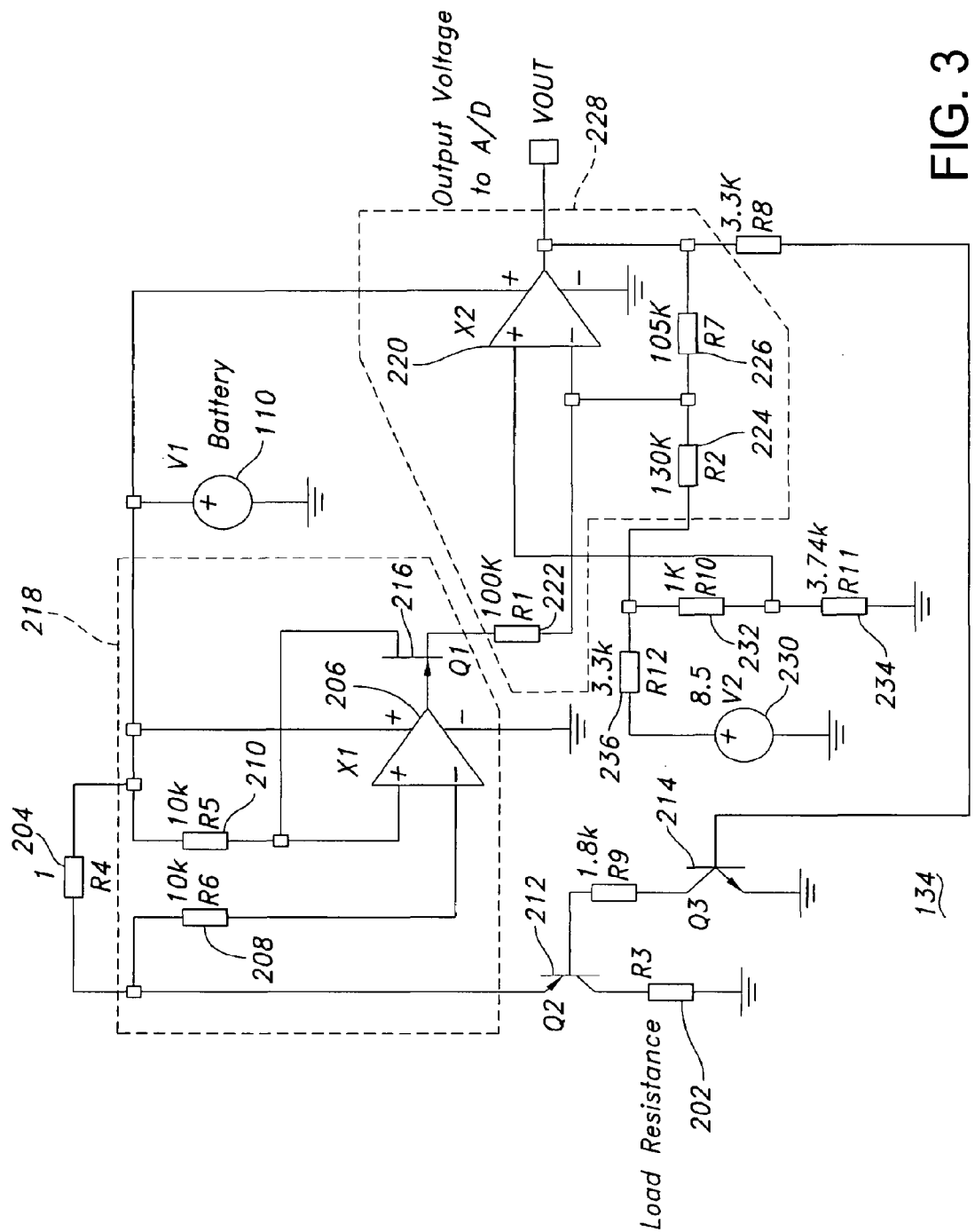
FIG. 3 is a schematic diagram of a current sensing circuit in accordance with an exemplary embodiment of the present invention.

FIG. 3 is a schematic diagram of the current sense and short circuit protection circuit 134 (referred to hereafter as the current sense circuit 134) in accordance with an exemplary embodiment of the present invention. The resistance values shown in FIG. 3 are exemplary in nature and not essential to the invention disclosed and claimed herein. Moreover, one of ordinary skill in the art would be able to identify appropriate component values for the current sense circuit 134 without undue experimentation given the benefit of the disclosure set forth herein.

The current sense circuit 134 is adapted to measure the current drawn by a load 202, which may comprise a resistance presented by the active antenna 104 (FIG. 2). In an exemplary embodiment of the present invention, the current sense circuit 134 is adapted to measure the flow of current in the presence of a significant and variable voltage, and to avoid over-ranging an analog-to-digital converter or other measurement display device. The main microprocessor 132 (FIG. 2) may comprise an analog-to-digital converter to provide a digital representation of a value of the current being drawn by the load 202.

The current sense 134 is powered by the battery 110 (FIG. 2). Current drawn by the load 202 also passes through a current sense resistor 204. The resistance of the current sense resistor 204 can be arbitrarily small to provide a minimal voltage drop between the battery 110 and the load 202. The voltage drop across the current sense resistor 204 is applied differentially to an operational amplifier 206 via a first input resistor 208 and a second input resistor 210. The current drawn by the load 202 also flows through a transistor 212. The transistor 212 is held in saturation by base drive supplied by a transistor 214, which is also normally saturated.

The operational amplifier 206, the first input resistor 208 and the second input resistor 210 work in conjunction with a transistor 216, to form a voltage-to-current converter circuit 218, shown in dashed lines in FIG. 3. The output current from the source of the transistor 216 is proportional to the voltage drop across the current sense resistor 204. The voltage drop across the current sense resistor 204 is applied across the second input resistor 210. Because the input terminals of the operational amplifier 206 are high impedance, the current that flows through the second input resistor 210 also flows through the transistor 216.

The transistor 216 is desirably a Junction Field Effect Transistor (JFET) rather than a bipolar transistor because JFETs are voltage-biased. This means that the problem of variation in bias current present in a bipolar transistor is not present in a JFET. This characteristic results in improved temperature stability for the current sense circuit 134. As an additional advantage, the use of a JFET also results in a relatively small gate current (leakage current not necessary to the operation of the JFET) compared to the base current of a bipolar transistor. Because the gate current of a typical JFET is very small, the gate current is subject to less variation that could otherwise occur during the relatively wide temperature variations encountered in the engine compartment of a motor vehicle.

The output of the voltage-to-current converter 218 is one of the inputs applied to a current-to-voltage converter circuit 228 (shown in dashed lines in FIG. 3) that includes an operational amplifier 220, a resistor 222, a resistor 224 and a resistor 226. Also provided to the current-to-voltage converter circuit 228 are bias voltages derived from a regulated voltage source 230. The bias voltages are determined by the values of a resistor 232, a resistor 234 and a resistor 236. Those of ordinary skill in the art will appreciate that converting a small voltage drop across the current sense resistor 204 into a current proportional to a load current drawn from the battery 110 and the subsequent re-conversion of the current to a voltage value proportional to the load current using the regulated voltage source 230 has the effect of reducing variations in sensed current based on temperature fluctuations. This is true because the regulated voltage source 230 is typically less susceptible to temperature variation than is the battery 110.

Those of ordinary skill in the art will appreciate that the circuitry around the operational amplifier 220 is adapted to provide a maximum output value when the current through the current sense resistor 204 is at a minimum. Moreover, the output voltage of the operational amplifier 220 falls as the current through the current sense resistor increases. The zero-current output voltage and the gain of the output of the operational amplifier 220 are adjusted by varying the component values of the circuit components of the current-to-voltage converter circuit 228 (the resistors 224, 226, 232, 234 and 236). The inverse-scaled output of the current-to-voltage converter circuit 228 prevents over-voltage damage to a circuit such as an analog-to-digital circuit that receives the output of the current-to-voltage converter circuit 228 because its output is at a predetermined maximum when the current being measured is zero, and falls to zero at some maximum current, determined by the choice of scaling components. A further increase in load current does not produce any further change in output.

Figure 4:
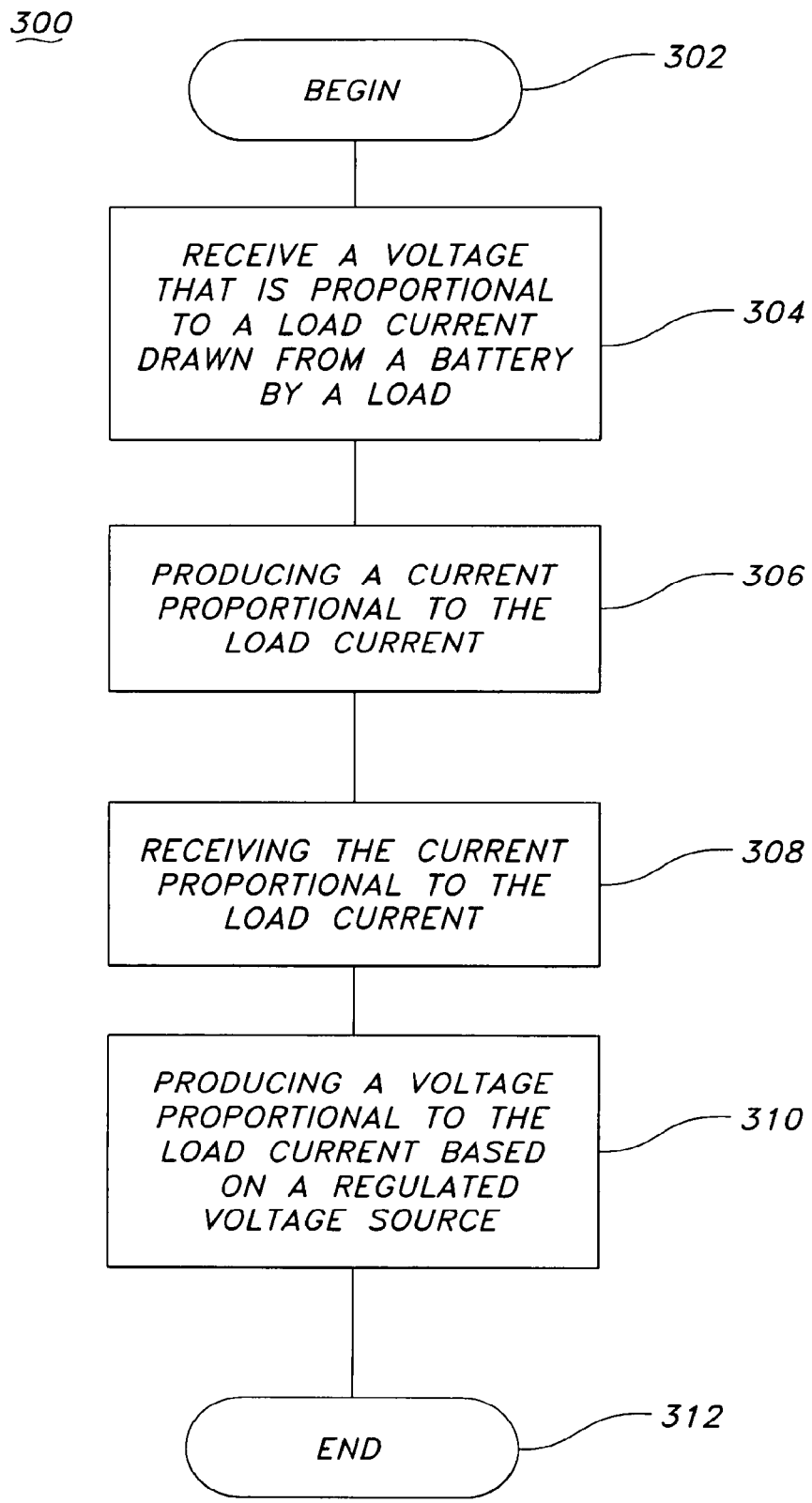
FIG. 4 is a process flow diagram of a method in accordance with an exemplary embodiment of the present invention.

FIG. 4 is a process flow diagram of a method in accordance with an exemplary embodiment of the present invention. The process is generally referred to by the reference number 300. At block 302, the process begins. A voltage that is proportional to a load current drawn from a battery by a load is received at block 304. At block 306, a current proportional to the load current is produced. The current proportional to the load current is received at block 308. At block 310, a voltage proportional to the load current based on a regulated voltage source is produced. The process ends at block 312.

Those of ordinary skill in the art will appreciate that exemplary embodiments of the present invention do not require tightly matched precision components to eliminate the effect of the varying common-mode voltage and/or varying temperature. Additionally, embodiments of the present invention do not require separate, isolated power supplies and/or expensive isolation components such as transformers or optical isolators. Unlike known current sense and short circuit protection circuits, exemplary embodiments of the present invention do not require additional components, such as clamping diodes, to protect against over-voltages at their outputs. Known methods of current limiting usually require a series resistance in line with the load that can drop enough voltage to turn on a transistor, around 0.7 volts. In contrast, an exemplary embodiment of the present invention makes use of the output that is already there to supply the base drive for the current limiting transistor.

Exemplary embodiments of the present invention facilitate accurate current measurement over a wide range of operating conditions. For example, the current sense circuit 134 may be adapted to accurately sense current flow despite fluctuations in a range of operating temperatures at a measurement site from about −40 to +85 degrees Celsius and battery voltage swings ranging from about 9 to 16 volts.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A motorized vehicle comprising an entertainment system that includes a current sense circuit, the current sense circuit comprising:
a voltage-to-current converter circuit that is adapted to receive a voltage that is proportional to a load current through a load and to produce a current proportional to the load current; and
a current-to-voltage converter circuit that is adapted to receive the current proportional to the load current and to produce a voltage proportional to the load current based on a regulated voltage source.

2. The motorized vehicle recited in claim 1, wherein the voltage-to-current converter circuit comprises a Junction Field Effect Transistor (JFET) transistor that produces the current proportional to the load current.

3. The motorized vehicle recited in claim 1, comprising a current sense resistor having a voltage drop that is applied differentially to the voltage-to-current converter circuit.

4. The motorized vehicle recited in claim 1, comprising an analog-to-digital converter that is adapted to produce a digital output corresponding to the voltage proportional to the load current.

5. The motorized vehicle recited in claim 1, wherein the current-to-voltage converter circuit is adapted to produce an output voltage that falls as the current proportional to the load current increases.

6. The motorized vehicle recited in claim 1, wherein the load comprises an active antenna.

7. The motorized vehicle recited in claim 1, wherein the current sense circuit comprises a portion of a vehicle audio subsystem.

8. The motorized vehicle recited in claim 1, wherein the voltage-to-current converter circuit comprises a single Junction Field Effect Transistor (JFET) transistor that solely produces the current proportional to the load current.

9. A method of sensing current drawn by a load within a motorized vehicle, the method comprising:
receiving a voltage that is proportional to a load current drawn by a load within the vehicle;
producing a current proportional to the load current;
receiving the current proportional to the load current; and
producing a voltage proportional to the load current based on a regulated voltage source.

10. The method recited in claim 9, wherein the current proportional to the load current is produced by a Junction Field Effect Transistor (JFET).

11. The method recited in claim 9, comprising differentially applying a voltage drop to produce the current proportional to the load current.

12. The method recited in claim 9, comprising producing a digital output corresponding to the voltage proportional to the load current.

13. The method recited in claim 9, comprising causing the voltage proportional to the load current to fall in response to a rise in the current proportional to the load current.

14. The method recited in claim 9, wherein the current proportional to the load current is produced solely by a single Junction Field Effect Transistor (JFET).

15. A motorized vehicle (10) comprising:
a chassis (18);
an engine (12) that is supported by the chassis (18);
a power train (14) adapted to be driven by the engine (12);
control electronics (16) that are adapted to control the engine (12) and the power train (14); and
an entertainment system (20) that includes an audio subsystem (22), the audio subsystem (22) being adapted to provide audio programming to occupants of the motorized vehicle (10), the audio subsystem (22) having a current sense circuit (134), the current sense circuit (134) comprising:
a voltage-to-current converter circuit (218) that is adapted to receive a voltage that is proportional to a load current drawn from a battery (110) by a load (202) and to produce a current proportional to the load current; and
a current-to-voltage converter circuit (228) that is adapted to receive the current proportional to the load current and to produce a voltage proportional to the load current based on a regulated voltage source (230).

16. The motorized vehicle (10) recited in claim 15, wherein the voltage-to-current converter circuit (218) comprises a JFET (216) that produces the current proportional to the load current drawn from the battery (110).

17. The motorized vehicle (10) recited in claim 15, comprising a current sense resistor (204) having a voltage drop that is applied differentially to the voltage-to-current converter circuit (218).

18. The motorized vehicle (10) recited in claim 15, comprising an analog-to-digital converter (132) that is adapted to produce a digital output corresponding to the voltage proportional to the load current.

19. The motorized vehicle (10) recited in claim 15, wherein the current-to-voltage converter circuit (228) is adapted to produce an output voltage that falls as the current proportional to the load current increases.

20. The motorized vehicle (10) recited in claim 15, wherein the load (202) comprises an active antenna (104).

\* \* \* \* \*